United States Patent
Yang et al.

(10) Patent No.: US 10,249,262 B2
(45) Date of Patent: Apr. 2, 2019

(54) DISPLAYS WITH ADJUSTABLE CIRCULAR POLARIZERS

(71) Applicant: Apple Inc., Cupertino, CA (US)

(72) Inventors: Young Cheol Yang, Sunnyvale, CA (US); Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1393 days.

(21) Appl. No.: 13/693,989

(22) Filed: Dec. 4, 2012

(65) Prior Publication Data

US 2014/0152703 A1 Jun. 5, 2014

(51) Int. Cl.
  *G09G 5/10* (2006.01)
  *F21V 9/14* (2006.01)
  *H01L 51/52* (2006.01)
  *G09G 3/00* (2006.01)
  *G09G 3/3208* (2016.01)

(52) U.S. Cl.
  CPC ........... *G09G 5/10* (2013.01); *F21V 9/14* (2013.01); *H01L 51/5281* (2013.01); *G09G 3/001* (2013.01); *G09G 3/3208* (2013.01); *G09G 2300/023* (2013.01); *G09G 2320/0238* (2013.01); *G09G 2360/144* (2013.01)

(58) Field of Classification Search
  None
  See application file for complete search history.

(56) References Cited

U.S. PATENT DOCUMENTS

| | | | |
|---|---|---|---|
| 3,853,398 A * | 12/1974 | Kano | G03F 9/7065 355/43 |
| 6,861,788 B2 | 3/2005 | Li et al. | |
| 6,975,455 B1 * | 12/2005 | Kotchick et al. | 359/485.03 |
| 7,411,637 B2 * | 8/2008 | Weiss | 349/16 |
| 2003/0098856 A1 * | 5/2003 | Li | G02F 1/133502 345/173 |
| 2005/0057701 A1 * | 3/2005 | Weiss | 349/10 |

(Continued)

FOREIGN PATENT DOCUMENTS

| | | |
|---|---|---|
| CN | 1556664 | 12/2004 |
| CN | 1953238 | 4/2007 |

(Continued)

*Primary Examiner* — David D Davis
(74) *Attorney, Agent, or Firm* — Treyz Law Group, P.C.; David K. Cole (57) ABSTRACT

An electronic device display may have an organic light-emitting diode layer that emits light to form images for a user. Reflective structures such as metal signal lines may be present in the organic light-emitting diode layer. Ambient light reflections from the metal signal lines may be suppressed using a circular polarizer on the organic light-emitting diode layer. To increase light emission efficiency from the organic light-emitting diode display layer under low ambient light conditions in which ambient light reflections are not significant, the polarization efficiency of the circular polarizer may be reduced. Control circuitry may make measurements of ambient light intensity using an ambient light sensor and can control the polarization efficiency of the circular polarizer accordingly by applying adjustable amounts of light or electric field. Polarization efficiency may also be adjusted using a photosensitive polarizer material that responds directly to changes in ambient light level.

14 Claims, 11 Drawing Sheets

(56) References Cited

U.S. PATENT DOCUMENTS

| | | | |
|---|---|---|---|
| 2006/0250553 A1* | 11/2006 | Chu | G02F 1/133528 |
| | | | 349/114 |
| 2010/0176382 A1 | 7/2010 | Park et al. | |
| 2011/0149212 A1* | 6/2011 | Tomita | 349/98 |
| 2012/0133743 A1* | 5/2012 | Hiramoto | H04N 13/20 |
| | | | 348/46 |
| 2012/0320012 A1 | 12/2012 | Tamaki et al. | |
| 2013/0120541 A1* | 5/2013 | Hiramoto | G03B 35/08 |
| | | | 348/50 |

FOREIGN PATENT DOCUMENTS

| | | |
|---|---|---|
| CN | 1982976 | 6/2007 |
| CN | 101135795 | 3/2008 |
| JP | 2002-23655 | 1/2002 |
| KR | 10-0953656 | 4/2010 |
| WO | 2003046872 | 6/2003 |
| WO | 2011107826 | 9/2011 |

\* cited by examiner

DISPLAYS WITH ADJUSTABLE CIRCULAR POLARIZERS

BACKGROUND

This relates generally to electronic devices, and more particularly, to electronic devices with displays.

Electronic devices often include displays. For example, cellular telephones and portable computers often include displays for presenting information to a user.

Some devices incorporate organic light-emitting diode displays. Organic light-emitting diode displays use thin-film circuitry to produce images. In bright ambient lighting conditions, organic light-emitting diodes can be prone to glare as ambient light is reflected from metal lines in the thin-film circuitry. Ambient light reflections can be suppressed by covering an organic light-emitting diode display with a circular polarizer. The presence of the circular polarizer helps minimized unwanted ambient light reflections, but reduces display brightness. The output level of a display with a circular polarizer can be maintained at desired levels by increasing drive currents in the thin-film circuitry, but this increases power consumption and reduces battery life.

It would therefore be desirable to provide improved displays such as organic light-emitting diode displays.

SUMMARY

An electronic device may be provided with a display mounted in a housing. The display may have an organic light-emitting diode layer that emits light to form images for a user. Structures such as metal signal lines may be present in the organic light-emitting diode layer.

Ambient light reflections from the metal signal lines may be suppressed by forming a circular polarizer on the organic light-emitting diode layer. The polarization efficiency of the circular polarizer may be varied as a function of ambient light level.

To increase light emission efficiency from the organic light-emitting diode display layer under low ambient light conditions in which ambient light reflections do not significantly impair use of the display, the polarization efficiency of the circular polarizer may be reduced. By reducing polarization efficiency in response to low ambient light levels, undesired reductions in display output efficiency due to the polarization properties of the circular polarizer can be avoided whenever the ambient light levels in the vicinity of the display are low.

At higher ambient light levels, the polarization efficiency of the circular polarizer can be restored to ensure that the circular polarizer can adequately suppress reflections from the reflective structures in the organic light-emitting display layer.

Control circuitry may make measurements of ambient light intensity using an ambient light sensor and can control the polarization efficiency of the circular polarizer accordingly by applying adjustable amounts of light or electric field to the circular polarizer. Polarization efficiency may also be adjusted using a photosensitive polarizer material in the circular polarizer that responds directly to changes in ambient light level.

Further features of the invention, its nature and various advantages will be more apparent from the accompanying drawings and the following detailed description of the preferred embodiments.

DETAILED DESCRIPTION

Electronic devices may include displays. The displays may be used to display images for a user. Illustrative electronic devices that may be provided with displays are shown in FIGS. 1, 2, 3, and 4.

Figure 1:
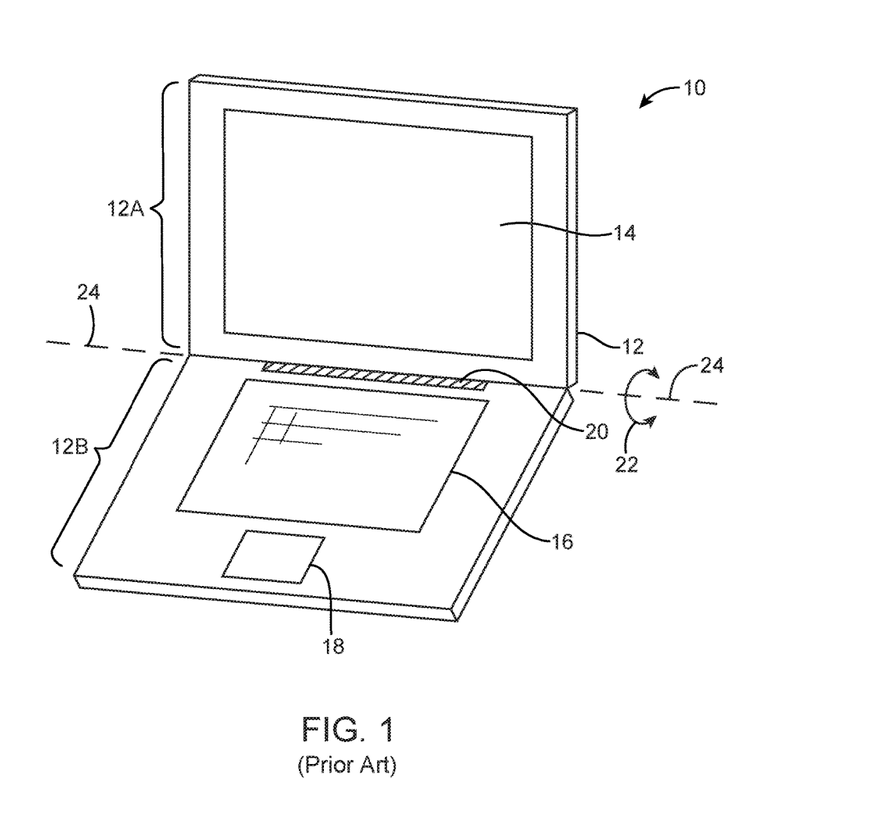
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
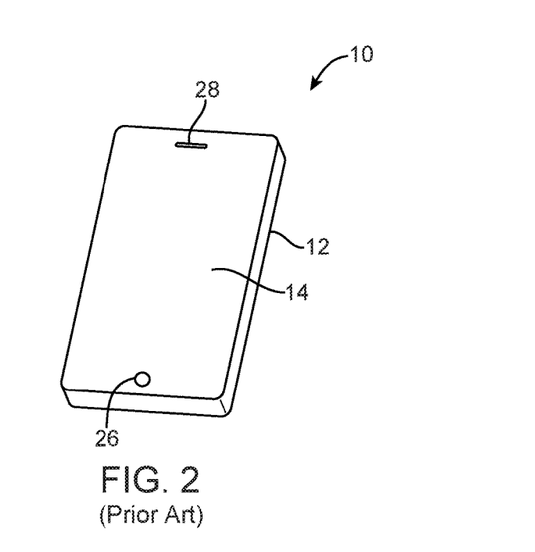
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
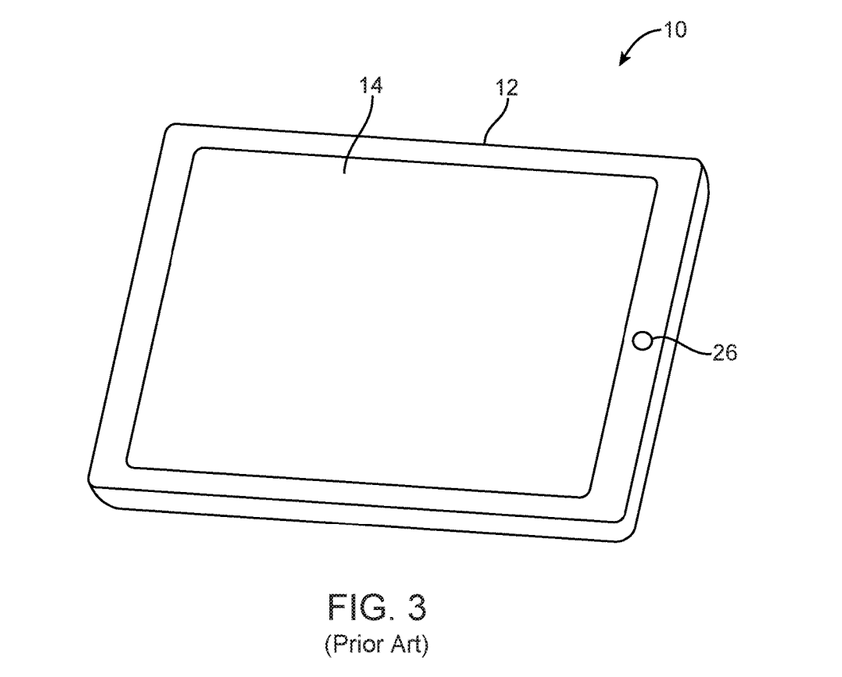
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
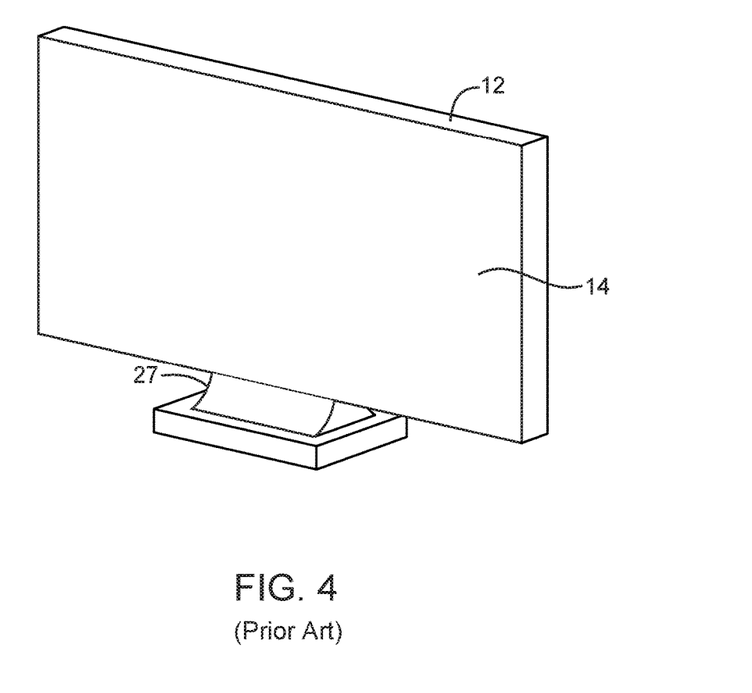
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode display components or other suitable image pixel structures. Display 14 may, for example, be an organic light-emitting diode display formed from a rectangular array of organic light-emitting diodes on a rigid substrate or a flexible substrate. Top emission or bottom emission organic light-emitting diode display structures may be used in forming display 14.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
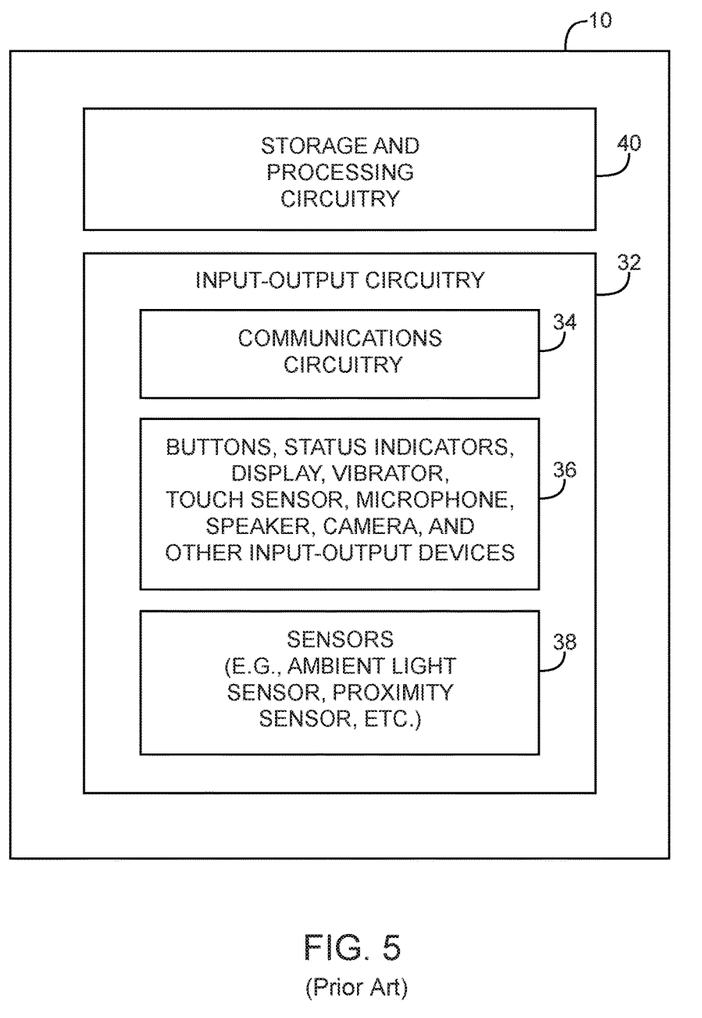
FIG. 5 is a schematic diagram of an illustrative electronic device of the type that may be provided with a display in accordance with an embodiment of the present invention.

A schematic diagram of device 10 is shown in FIG. 5. As shown in FIG. 5, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 may be used in controlling the operation of device 10. The processing circuitry may be based on a processor such as a microprocessor and other integrated circuits.

With one suitable arrangement, storage and processing circuitry 40 may run software on device 10 such as internet browsing applications, email applications, media playback applications, operating system functions, software for capturing and processing images, software for implementing functions associated with gathering and processing sensor data, etc.

Input-output circuitry 32 may be used to allow data to be supplied to device 10 and to allow data to be provided from device 10 to external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as buttons, joysticks, click wheels, scrolling wheels, a touch screen such as display 14, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensors 38 may include an ambient light sensor for gathering information on ambient light levels. The ambient light sensor may include one or more semiconductor detectors (e.g., silicon-based detectors) or other light detection circuitry. Sensors 38 may also include proximity sensor components. The proximity sensor components may include a dedicated proximity sensor and/or a proximity sensor formed from touch sensors (e.g., a portion of the capacitive touch sensor electrodes in a touch sensor array for display 14 that are otherwise used in gathering touch input for device 10). Proximity sensor components in device 10 can include capacitive proximity sensor components, infrared-light-based proximity sensor components, proximity sensor components based on acoustic signaling schemes, or other proximity sensor equipment. Sensors 38 may also include a pressure sensor, a temperature sensor, an accelerometer, a gyroscope, and other circuitry for making measurements of the environment surrounding device 10.

Figure 6:
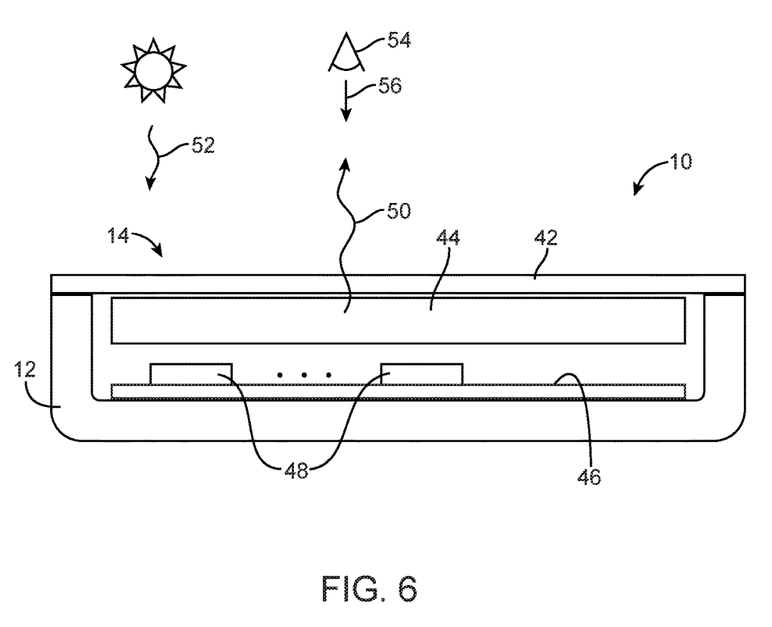
FIG. 6 is a cross-sectional side view of an electronic device with a display in accordance with an embodiment of the present invention.

As shown in the cross-sectional side view of electronic device 10 of FIG. 6, electronic device 10 may include internal device components such as components 48. Components 48 may include sensors, integrated circuits, buttons, connectors, and other circuitry of the type shown in FIG. 5. Components 48 may be mounted on one or more substrates such as substrate 46. Substrate 46 may be a dielectric carrier such as a molded plastic carrier or a printed circuit. For example, substrate 46 may be a printed circuit such as a rigid printed circuit formed from a material such as fiberglass-filled epoxy or may be a flexible printed circuit formed from a sheet of polyimide or other flexible polymer layer.

Display 14 may include a display cover layer such as display cover layer 42 and a display module such as display module 44. Display cover layer 42 may be formed from a transparent layer of material such as a clear glass layer or a transparent planar member. Display module 44 may be formed from an organic light-emitting diode layer (sometimes referred to as an organic light-emitting diode display or organic light-emitting diode array).

During operation of device 10, viewer 54 may view display 14 in direction 56. Organic light-emitting diode display layer 44 may emit light 50 that forms images for viewer 54 on display 14. Ambient light 52 may also reflect off of structures within display layer 44. In particular, reflective structures such as metal lines in organic light-emitting diode display 44 may have a tendency to reflect ambient light 52. To avoid image degradation from ambient light that is reflected from structures such as metal lines, a circular polarizer may be formed on the surface of organic light-emitting diode display 44. The polarizer may reduce ambient light reflections.

Figure 7:
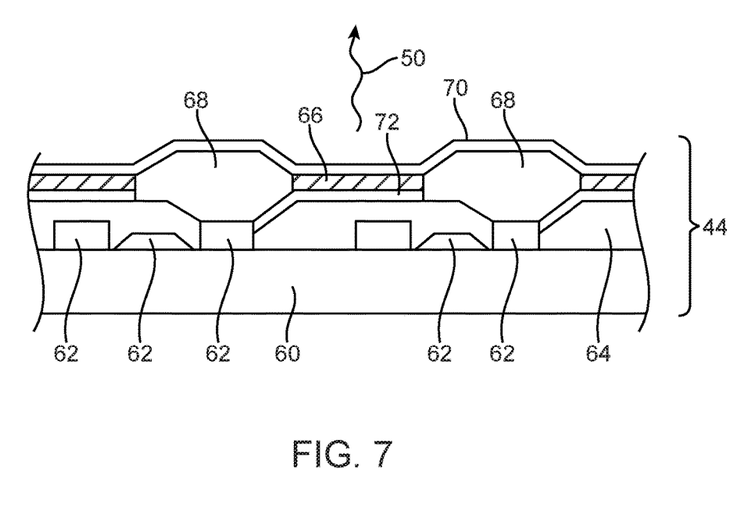
FIG. 7 is a cross-sectional side view of a portion of an illustrative organic light-emitting diode display in accordance with an embodiment of the present invention.

FIG. 7 is a cross-sectional side view of an illustrative organic light-emitting diode display structure of the type that may be used in forming organic light-emitting diode display layer 44 of FIG. 6. In the example of FIG. 7, organic light-emitting diode display layer 44 is a top emission display. If desired, display 44 may be implemented using bottom emission display technology.

As shown in FIG. 7, organic light-emitting diode display 44 may have a substrate such as substrate 60. Substrate 60 may be, for example, a layer of glass. Signal lines such as metal signal lines 62 may be formed on glass layer 60. Planarization layer 64 may be formed on top of signal lines 62 and substrate 60. Light 50 may be produced by driving current through organic emissive material 66 using lower electrode 72 and upper electrode 70 (e.g., a layer of indium tin oxide). Spacer structures such as dielectric spacers 68 may help separate adjacent display pixels in the array of display pixels that forms display layer 44.

Figure 8:
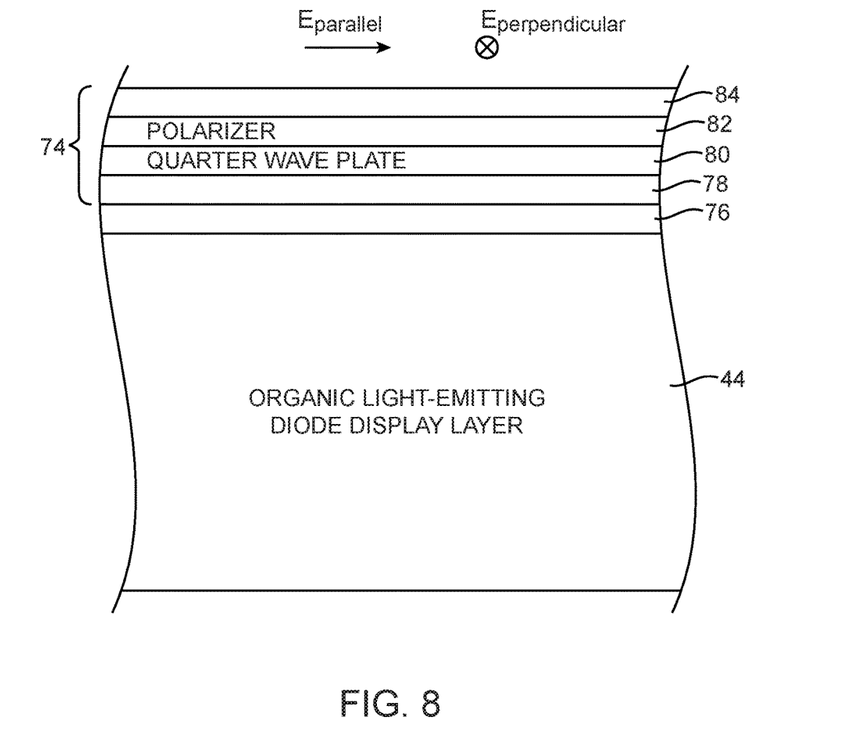
FIG. 8 is a cross-sectional side view of an organic light-emitting diode display that has been provided with an ambient light sensitive circular polarizer in accordance with an embodiment of the present invention.

Ambient light reflections from metal lines such as lines 62 of FIG. 7 may be suppressed by forming a circular polarizer such as circular polarizer 74 of FIG. 8 on top of organic light-emitting diode array layer 44. Adhesive 76 may be used to attach circular polarizer 74 to layer 44. Polarizer 74 may include supporting layers of material such one or more layers of tri-acetyl cellulose (TAC), a linear polarizer layer such as linear polarizer layer 82, a quarter wave plate such as layer 80 (to convert linearly polarized light into circularly polarized light), and an additional layer 84.

A circular polarizer layer can suppress ambient light reflections from reflective structures in layer 44 such as metal lines 62 of FIG. 7, but has the potential to reduce the amount of emitted light 50 from layer 44 that reaches viewer 54. In particular, the amount of light 50 that passes through a polarizer layer will depend on the polarization state of that light (e.g., parallel to the linear polarizer as illustrated by electric field orientation Eparallel of FIG. 8 or perpendicular to the linear polarizer as illustrated by electric field orientation E perpendicular of FIG. 8).

Particularly in dim lighting conditions in which ambient light reflections are low, the potential reduction in emitted light efficiency due to the presence of a circular polarizer on top of layer 44 is a concern. In this type of situation, the polarizer is not needed to suppress ambient light reflections, but has the potential to reduce the amount of light that is transmitted out of the display.

Display 14 preferably incorporates an adjustable polarizer to address this challenge. The adjustable polarizer, which may sometimes be referred to as an ambient light sensitive polarizer or controllable polarizer, may exhibit polarization characteristics that vary as a function of ambient light level. At relatively large ambient light levels, when the full reflection-suppressing capabilities of the circular polarizer layer are needed, the polarizer is configured to operate with its maximum efficiency. At relatively low ambient light levels, however, when high polarization efficiencies merely serve to cut down on transmitted light intensities and thereby dim the display, the polarizer is configured to operate with a reduced amount of polarization efficiency. Polarization efficiency may be controlled based on ambient light level by using a polarizer material that is directly sensitive to light exposure and/or by using ambient light sensor structures to monitor ambient light conditions and using control circuitry to adjust the properties of the polarizer accordingly.

Figure 9:
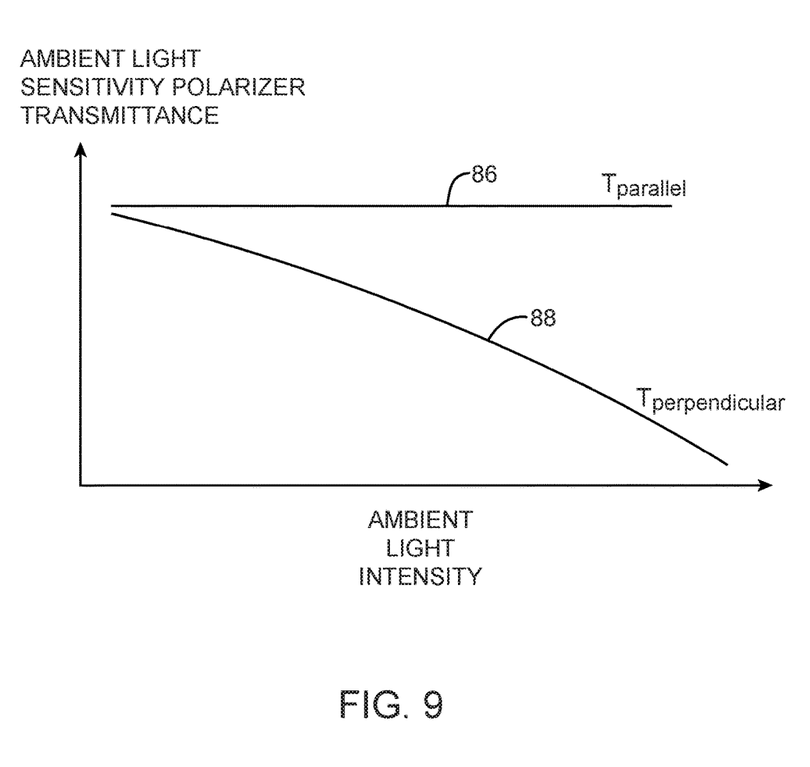
FIG. 9 is a graph showing how polarization efficiency may vary as a function of ambient light levels in an adjustable circular polarizer for a display accordance with an embodiment of the present invention.

FIG. 9 is a graph showing how transmitted light intensity from display layer 44 may vary as a function of ambient light intensity for both the parallel and perpendicular electric field orientations of FIG. 8. In this example, linear polarizer layer 82 has a polarization efficiency that varies as a function of ambient light intensity.

Transmittance Tparallel of FIG. 9 represents that amount of light that is transmitted through circular polarizer layer 74 as a function of ambient light intensity when the light has an electric field (Eparallel) that is aligned with linear polarizer 82. Because Eparallel is aligned with polarizer 82, light with polarization Eparallel is transmitted through polarizer 82 regardless of the efficiency of polarizer 82 (and therefore regardless of ambient light intensity), as indicated by the flat shape of curve 86.

Transmittance Tperpendicular of FIG. 9 represents the amount of light that is transmitted through circular polarizer layer 74 as a function of ambient light intensity when the light has an electric field (Eperpendicular) that is perpendicular to the polarization direction of linear polarizer 82. Because Eperpendicular is perpendicular to the orientation of linear polarizer 82, light with polarization Eperpendicular is blocked (i.e., transmittance Tperpendicular is small) when the polarizer is operating efficiently at high ambient light intensities. At low ambient light intensities, the efficiency of polarizer 82 is low, so even though Eperpendicular is perpendicular to polarizer 82, polarizer 82 becomes ineffective at blocking light with polarization Eperpendicular (i.e., transmittance Tperpendicular is high).

Figure 10:
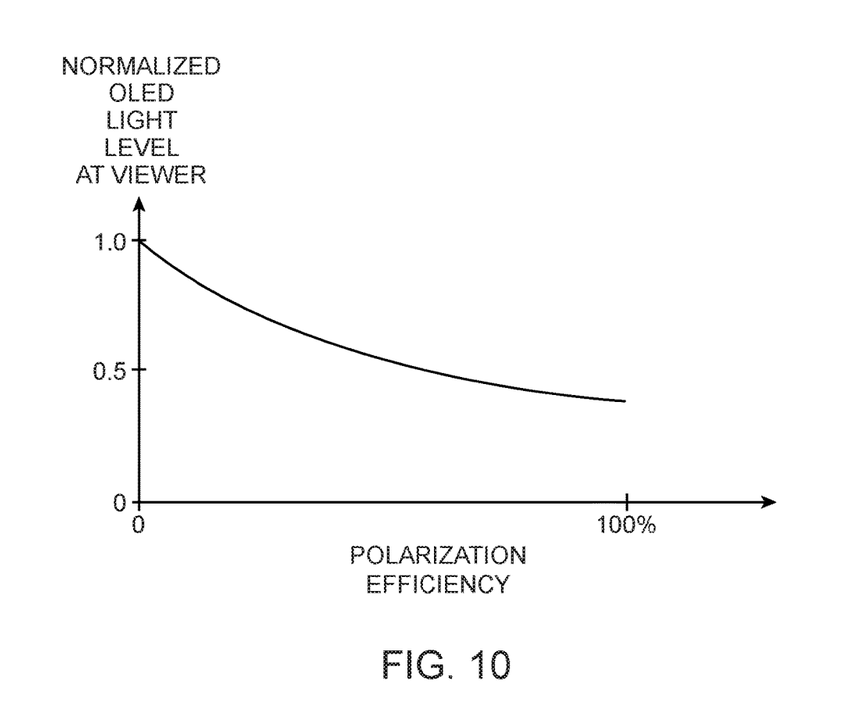
FIG. 10 is a graph showing how the amount of light that is emitted from an organic light-emitting diode display having an ambient light level sensitive circular polarizer may vary as a function of polarization efficiency in accordance with an embodiment of the present invention.
Figure 11:
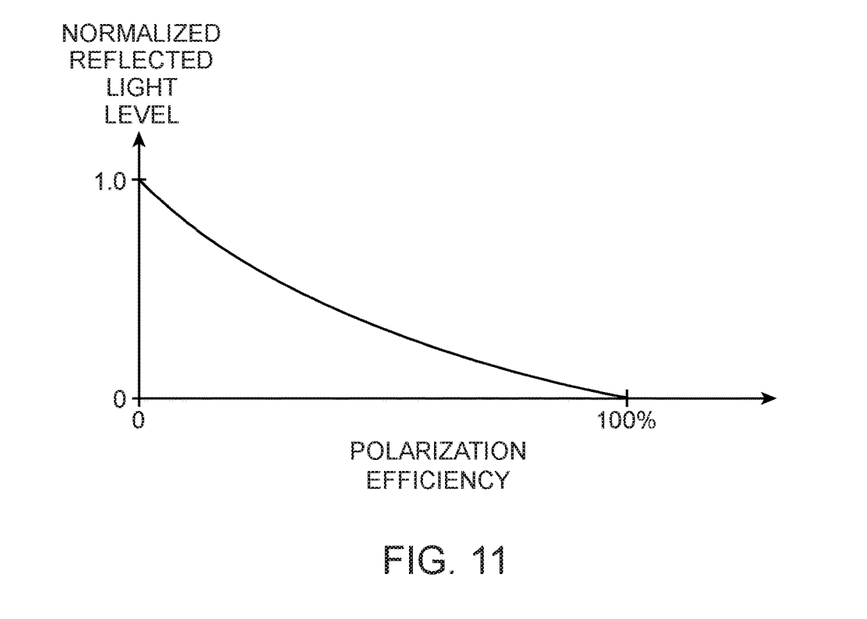
FIG. 11 is a graph showing how the amount of light that is reflected from an organic light-emitting diode display having an ambient light level sensitive circular polarizer may vary as a function of polarization efficiency in accordance with an embodiment of the present invention.

The impact of changes in polarization efficiency on reflected ambient light and transmitted light 50 from organic light-emitting diode layer 44 is shown in the graphs of FIGS. 10 and 11. The graph of FIG. 10 is a normalized plot of the amount of light 50 that has been emitted from organic light-emitting diode layer 44 and that has been successfully transmitted through polarizer 74 as a function of polarization efficiency.

As shown in FIG. 10, at relatively high polarization efficiencies (i.e., at relatively high ambient light levels where the efficiency of polarizer 82 and therefore polarizer 74 is high), half of light 50 is blocked (i.e., the half of light 50 that is polarized perpendicular to polarizer 82) and half of light 50 is transmitted (i.e., the half of light 50 that is polarized parallel to polarizer 82). The normalized amount of light emitted by display 14 when ambient light levels are high and polarizer efficiency is at 100% is therefore 0.5.

At relatively low polarization efficiencies (i.e., at relatively low ambient light levels where the efficiency of polarizer 82 and therefore polarizer 74 is low), the half of light 50 that would be blocked at high polarization efficiencies is transmitted through polarizer 82, even though its polarization is perpendicular to polarizer 82. The normalized amount of light emitted when ambient light levels are low and polarizer efficiency is at 0% is therefore high (i.e., 1.0).

The impact of changes in polarization efficiency on reflected ambient light is shown in the graph of FIG. 11. The graph of FIG. 11 is a normalized plot of the amount of ambient light 52 that is reflected from organic light-emitting diode layer 44 (display 14) as a function of polarization efficiency.

As shown in FIG. 11, at relatively high polarization efficiencies (i.e., at relatively high ambient light levels), the efficiency of circular polarizer 74 is high. As a result, the ability of circular polarizer 74 to suppress light reflections from metal structures in display module 44 such as lines 62 is maximized and the normalized amount of reflected ambient light is 0.

At relatively low polarization efficiencies (i.e., at relatively low ambient light levels), the efficiency of circular polarizer 74 is low. As a result, the ability of circular polarizer 74 to suppress light reflections from metal structures in display module 44 such as lines 62 is reduced. The normalized amount of reflected ambient light is 1. Even though ambient light reflections are not well suppressed in this situation, the absolute (not normalized) amount of ambient light that is reflected from display 14 is not too high, because the total amount of ambient light that is present in this situation is low.

As the curves of FIGS. 10 and 11 demonstrate, the variable polarization efficiency of polarizer 74 allows undesired ambient light reflections at high ambient light levels to be satisfactorily suppressed, because polarizer 74 has high efficiency at high ambient light levels (see, e.g., the right-hand side of FIG. 11). The variable polarization efficiency of polarizer 74 also allows power to be conserved in situations in which ambient light levels are low. This is because polarization efficiency is low at low ambient light levels, which effectively turns off the undesired emitted light blocking characteristic of polarizer 74 (see, e.g., the left-hand side of FIG. 10).

Polarizer efficiency can be varied as a function of ambient light intensity by using a photosensitive material for forming polarizer layer 82 (e.g., a material that exhibits polarization efficiency changes based on exposure to ultraviolet light or other light in the ambient light). Polarization efficiency for polarizer 74 can also be adjusted by dynamically measuring ambient light levels using an ambient light sensor (e.g., one of sensors 38 of FIG. 5) and applying light or electrical signals to polarizer layer 82 that change the polarization efficiency of polarizer layer 82.

Figure 12:
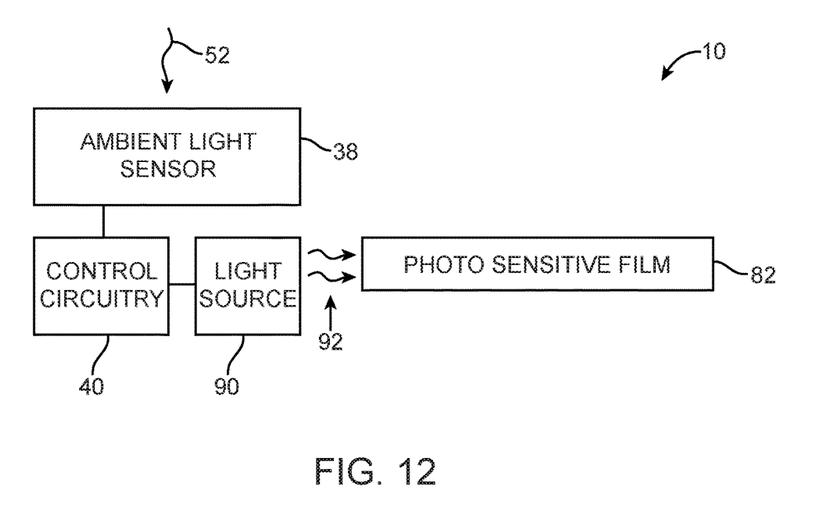
FIG. 12 is a schematic diagram of electronic device structures in a configuration in which an internal light source is used to adjust circular polarizer efficiency for an organic light-emitting diode display in accordance with an embodiment of the present invention.

FIG. 12 is a system diagram of an illustrative portion of device 10 in which the polarization of circular polarizer 74 is adjusted by applying light 92 to polarizer 82 as a function of measured ambient light level. Readings from ambient light sensor 38 are processed by control circuitry 40. Control circuitry 40 can use ambient light sensor 38 to measure how much ambient light is striking device 10 and display 14 during operation of device 10 by a user.

The amount of ambient light that is measured by control circuitry 40 may be used by control circuitry 40 in adjusting light output from light source 90. Light source 90 may be a laser, a light-emitting diode, a lamp, part of layer 44, or other light source that produces light 92. Light 92 may include infrared light, visible light, and/or ultraviolet light. Light 92 may be applied to linear polarizer 82. For example, light 92 may be launched into one of the edges of linear polarizer 82, so that light 92 travels through the interior of polarizer 82 due to total internal reflection. Alternatively, light 92 may be applied to linear polarizer 82 through other layers in display 14.

Polarizer layer 82 may be formed from a photosensitive film that is responsive to light 92. When a first amount of light 92 is applied to layer 82, polarizer 82 may be characterized by a first polarization efficiency. When a second amount of light 92 is applied to layer 82 that is different than the first amount of light, polarizer 82 may be characterized by a second polarization efficiency that is different than the first polarization efficiency. The amount of polarization efficiency change that is exhibited by polarizer 82 as a function of a given amount of change in the magnitude of applied light 92 may be linear or nonlinear.

During operation, control circuitry 40 can determine ambient light levels using ambient light data from ambient light sensor 38. When measured ambient light levels are relatively high, control circuitry 40 can use light source 92 to generate an amount of light 92 that makes polarization layer 82 exhibit a relatively high polarization efficiency. In this situation, ambient light reflections will be well suppressed by the operation of circular polarizer 74. In response to measuring ambient light levels that are relatively low, control circuitry 40 can use light source 92 to generate an amount of light 92 that makes polarization layer 82 exhibit a relatively low polarization efficiency. In this situation, polarizer 74 will block a reduced amount of light from layer 44 and light emission efficiency for display 14 will be high, allowing power to be conserved.

Figure 13:
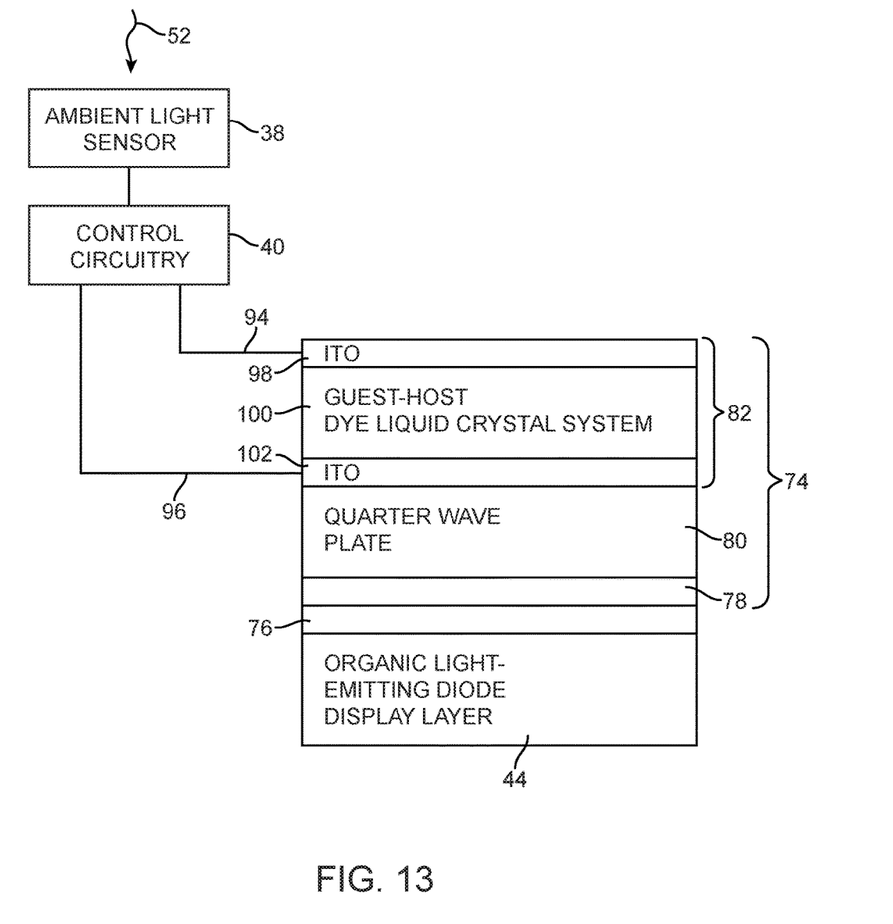
FIG. 13 is a schematic diagram of electronic device structures in a configuration in which control circuitry that applies an adjustable electric field to a guest-host dye liquid crystal system layer is used to adjust circular polarizer efficiency for an organic light-emitting diode display in accordance with an embodiment of the present invention.

FIG. 13 is a system diagram of an illustrative portion of device 10 in which the polarization of circular polarizer 74 is adjusted by applying an electric field to polarizer 82. Circular polarizer 74 may be attached to the surface of organic light-emitting diode display layer 44 using a layer of adhesive such as adhesive 76. Quarter wave plate 80 may be formed between linear polarizer 82 and a structural layer of polymer such as polymer layer 78 (e.g., a layer of tri-acetyl cellulose).

Polarizer 82 may be formed from a material such as guest-host liquid crystal system layer 100, which changes its polarization efficiency as a function of applied electric field. Layer 100 may be sandwiched between upper transparent electrode 98 and lower transparent electrode 102. Electrodes 98 and 102 may be formed from sheets of transparent conductive material such as indium tin oxide.

An electric field may be applied across layer 100 by applying a voltage across electrodes 98 and 102 with control circuitry 40. During operation, readings from ambient light sensor 38 are processed by control circuitry 40. The magnitude of ambient light that is measured using ambient light sensor 38 may be used by control circuitry 40 in adjusting the magnitude of the voltage applied across electrodes 98 and 102. This allows control circuitry 40 to adjust the polarization layer 74 as a function of measured ambient light level.

When measured ambient light levels are relatively high, control circuitry 40 can apply an electric field to layer 100 that causes polarizer 74 to exhibit a relatively high polarization efficiency. In this situation, ambient light reflections will be well suppressed by the operation of polarizer 74. In response to measuring ambient light levels that are relatively low, control circuitry 40 can apply an electric field to layer 100 that causes polarizer 74 to exhibit a relatively low polarization efficiency. In this situation, polarizer 74 will block a reduced amount of light from layer 44 and light emission efficiency for display 14 will be high, allowing power to be conserved.

The foregoing is merely illustrative of the principles of this invention and various modifications can be made by those skilled in the art without departing from the scope and spirit of the invention.

What is claimed is:

1. A display, comprising:
    a display layer that emits light that forms images; and
    a circular polarizer on the display layer that suppresses reflections from structures in the display layer, wherein the circular polarizer comprises a polarizer layer with an adjustable polarization efficiency, wherein the polarizer layer comprises a layer of photosensitive material, and wherein the polarization efficiency is adjusted in response to light applied to the photosensitive material.

2. The display defined in claim 1 wherein the display layer comprises an organic light-emitting diode layer.

3. The display defined in claim 1 further comprising a light source that is configured to apply the light to the layer of photosensitive material.

4. The display defined in claim 3 wherein the light source is configured to produce ultraviolet light.

5. The display defined in claim 1 wherein first and second amounts of light are applied to the photosensitive material, wherein the first amount of light is greater than the second amount of light, wherein the photosensitive material increases polarization efficiency in response to the first amount of light, and wherein the photosensitive material decreases polarization efficiency in response to the second amount of light.

6. An electronic device, comprising:
    an ambient light sensor that is configured to measure ambient light levels;
    control circuitry coupled to the ambient light sensor;
    a display having an adjustable polarizer that receives light emitted from the display in a first direction, wherein the control circuitry is configured to adjust the adjustable polarizer based on measured ambient light levels from the ambient light sensor; and
    a light source that applies additional light to the adjustable polarizer from a second direction that is different than the first direction, wherein the control circuitry is configured to direct the light source to apply the additional light to the adjustable polarizer based on the ambient light levels.

7. The electronic device defined in claim 6 wherein the control circuitry is configured to direct the light source to apply a first amount of the additional light to the adjustable polarizer in response to measuring a first amount of ambient light with the ambient light sensor, wherein the control circuitry is configured to direct the light source to apply a second amount of the additional light to the adjustable polarizer in response to measuring a second amount of ambient light with the ambient light sensor, and wherein the first amount of ambient light is different than the second amount of ambient light.

8. The electronic device defined in claim 7 wherein the display comprises an organic light-emitting diode display.

9. The electronic device defined in claim 7 wherein the adjustable polarizer comprises a circular polarizer.

10. The electronic device defined in claim 6 wherein the adjustable polarizer comprises a circular polarizer.

11. The electronic device defined in claim 6, further comprising:
    an electronic device housing in which the ambient light sensor, the control circuitry, the display, and the light source are mounted.

12. The electronic device defined in claim 6 wherein the adjustable polarizer has an adjustable polarization efficiency, wherein the adjustable polarizer has a layer of photosensitive material, and wherein the control circuitry is configured to direct the light source to apply the additional light to the adjustable polarizer to change the polarization efficiency.

13. A method of operating an organic light-emitting diode display that has an adjustable circular polarizer in an electronic device that has an ambient light sensor and control circuitry, wherein the adjustable circular polarizer comprises electrodes for applying an electric field to a layer of material that exhibits changes in polarization efficiency based on applied electric field levels, the method comprising:
    with the control circuitry, gathering ambient light readings from the ambient light sensor; and
    with the control circuitry, adjusting a transmittance of the adjustable circular polarizer from a first non-zero transmittance value to a second non-zero transmittance value and from the second non-zero transmittance value to a third non-zero transmittance value based on the ambient light readings, wherein the first, second, and third non-zero transmittance values are different, wherein adjusting the adjustable circular polarizer comprises controlling how much electric field is applied to the layer of material with the electrodes.

14. The method defined in claim 13 wherein the layer of material comprises a guest-host dye liquid crystal material and wherein adjusting the circular polarizer comprises adjusting electric fields applied to the guest-host dye liquid crystal material based on the ambient light readings to increase polarization efficiency at higher ambient light levels to suppress reflections from metal lines in the organic light-emitting diode display and to decrease polarization efficiency at lower ambient light levels to increase light emission efficiency from the organic light-emitting diode display.

* * * * *